(12) United States Patent
Hwang

(10) Patent No.: US 7,501,326 B2
(45) Date of Patent: Mar. 10, 2009

(54) METHOD FOR FORMING ISOLATION LAYER OF SEMICONDUCTOR DEVICE

(75) Inventor: Jong Taek Hwang, Cheongju-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 105 days.

(21) Appl. No.: 11/643,141

(22) Filed: Dec. 19, 2006

(65) Prior Publication Data

US 2007/0166934 A1  Jul. 19, 2007

(30) Foreign Application Priority Data

Dec. 29, 2005  (KR) .................. 10-2005-0133965

(51) Int. Cl.
*H01L 21/76* (2006.01)
*H01L 21/36* (2006.01)
*H01L 21/42* (2006.01)

(52) U.S. Cl. .................. 438/296; 438/435; 438/485; 438/513; 257/E21.548; 257/E21.576; 257/E21.245

(58) Field of Classification Search .......... 257/E21.548, 257/E21.576, E21.245
See application file for complete search history.

(56) References Cited

U.S. PATENT DOCUMENTS

| 6,713,407 | B1 * | 3/2004 | Cheng et al. | 438/775 |
| 2003/0008492 | A1 * | 1/2003 | Jung et al. | 438/624 |
| 2003/0143817 | A1 * | 7/2003 | Ho et al. | 438/435 |
| 2005/0181598 | A1 * | 8/2005 | Kailasam | 438/654 |

* cited by examiner

*Primary Examiner*—Walter L Lindsay, Jr.
*Assistant Examiner*—Mohsen Ahmadi
(74) *Attorney, Agent, or Firm*—Andrew D. Fortney

(57) ABSTRACT

A method for forming an isolation layer of a semiconductor device using a shallow trench isolation method is provided. The method includes: vertically etching a region of an insulating layer and a part of a semiconductor substrate corresponding thereto to form a trench; depositing an oxide layer on an entire surface of the semiconductor substrate to fill the trench; plasma-sputtering at least a surface part of the oxide layer; and removing the oxide layer using chemical mechanical polishing (CMP) so that the oxide layer remains only in the trench. The method may remove sharp parts of the oxide layer and reduce or prevent the occurrence of scratches during the CMP process.

14 Claims, 6 Drawing Sheets

METHOD FOR FORMING ISOLATION LAYER OF SEMICONDUCTOR DEVICE

BACKGROUND OF THE INVENTION

1. Field of the Invention

The present invention relates to a method for forming an isolation layer of a semiconductor device, and more particularly, to a method for forming an isolation layer of a semiconductor device using a shallow trench isolation method.

2. Description of the Related Art

A plurality of cells composed of a unit device such as a transistor and a capacitor are integrated within a restricted area according to a capacity of a semiconductor device.

However, such cells need an electric isolation for separate operation characteristics.

Accordingly, as an electric isolation method between these cells, a local oxidation of silicon (LOCOS) method and a shallow trench isolation (STI) method are widely known. Here, the LOCOS method recesses a silicon substrate and grows a field oxide layer. The STI method etches a silicon substrate in a vertical direction to form a trench and to fill the trench with insulating materials.

However, in the LOCOS method, a field oxide layer (in particular, a "bird's beak" or edge portion of the field oxide layer) may extend into an active region, with the result that the area of the active region may be reduced.

In contrast to this, since the STI method makes a shallow trench using a dry etch technology such as reactive ion etching or plasma etching, and fills the trench by depositing an insulating layer using a technology such as chemical vapor deposition (CVD), the bird's beak does not occur. Furthermore, because a surface of the trench filled with the insulating layer in the STI method becomes flat, the area occupied by a device isolation structure is small, which can be well adapted for a miniaturization of a semiconductor device.

Hereinafter, a method for forming an isolation layer of a semiconductor using a shallow trench isolation method according to the related art will be explained with reference to the accompanying drawings.

FIGS. 1A through 1E are cross-sectional views for illustrating an isolation layer of a semiconductor device using a shallow trench isolation method according to the related art.

First, as shown in FIG. 1A, after a pad oxide layer 12 and a nitride layer 14 have been sequentially on the silicon substrate 10, a photoresist pattern 16 is formed at an upper portion of the nitride layer 14 in order to expose a device isolation region.

Next, as shown in FIG. 1B, the pad oxide layer 12, the nitride layer 14, and the silicon substrate 10 are etched to a predetermined depth using the photoresist pattern 16 as a mask to form a trench. Here, the region in which the trench is formed becomes a non-active (or field) region, whereas the remaining region(s) (other than the trench) become the active region(s).

Then, as shown in FIG. 1C, an oxide layer 18 is formed on the entire surface of the resulting structure, including the trench.

Thereafter, as shown in FIG. 1D, the oxide layer 18 is removed using a chemical mechanical polishing (CMP) method to remove the oxide layer 18 from areas other than the trench, keeping it only in the trench.

Subsequently, as shown in FIG. 1E, the nitride layer 14 is etched away to obtain an isolation layer, which is made of an oxide layer.

However, the method for forming an isolation layer of a semiconductor using a shallow trench isolation method according to the related art has following problems.

Referring to FIG. 1C, due to a step coverage between the formation region of the trench and the active area, the oxide layer 18 may have a wave shape in the resulting structure, including the trench. If circumstances require, a wave shape including sharp parts can be formed (see the A region of FIG. 1C).

However, when sharp parts are formed in the oxide layer, during a CMP process of FIG. 1D, the sharp parts may not be polished, but instead, may be broken, thereby potentially causing scratches in the underlying oxide film and the silicon substrate (since the oxide film 12 in the active area may be quite thin).

SUMMARY OF THE INVENTION

Accordingly, the present invention is directed to a method for forming an isolation layer of a semiconductor device that substantially obviates one or more problems due to limitations and disadvantages of the related art.

Accordingly, an object of the present invention is to provide a method for forming an isolation layer of a semiconductor device, which preventing the occurrence of scratches in a silicon substrate due to sharp parts of an oxide layer during a CMP process.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure(s) particularly pointed out in the written description and claims hereof as well as the appended drawings.

To achieve these objects and other advantages and in accordance with the purpose of the invention, as embodied and broadly described herein, there is provided a method for forming an isolation structure of a semiconductor device comprising: vertically etching a region of an insulating layer and an underlying part of a semiconductor substrate corresponding thereto to form a trench; depositing an oxide layer on an entire surface of the semiconductor substrate to fill the trench; plasma-sputtering at least a part of a surface of the oxide layer; and removing the oxide layer by chemical mechanical polishing so that the oxide layer remains only in the trench.

In one embodiment of the present invention, the plasma-sputtering step uses a mixed gas of argon and helium. In alternative embodiments, plasma-sputtering comprises exposing the oxide layer to a plasma formed from argon and/or helium.

In one embodiment of the present invention, the surface part of the oxide layer is formed at an upper edge of the trench.

In another embodiment of the present invention, a method for forming an isolation structure of a semiconductor device comprises: forming a first insulating layer on a semiconductor substrate; forming a second insulating layer on the first insulating layer; vertically etching regions of the first and second insulating layers and a part of the semiconductor substrate corresponding thereto to form a trench; depositing an oxide layer an entire surface of the semiconductor substrate by to fill the trench; plasma-sputtering at least a part of a surface of the oxide layer; and removing the oxide layer by chemical mechanical polishing so that the oxide layer remains only in the trench.

In further embodiments of the present invention, the plasma-sputtering step uses argon, helium, or a mixed gas of argon and helium.

In a further embodiment of the present invention, the surface part of the oxide layer removed by plasma-sputtering is formed at an upper edge of the trench.

In a further embodiment of the present invention, the first insulating layer comprises (or consists essentially of) an oxide layer, and the second insulating layer comprises (or consists essentially of) a nitride layer.

In a further embodiment of the present invention, the method further comprises removing the second insulating layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a method for forming an isolation layer of a semiconductor device according to the present invention will be explained with reference to the accompanying drawings.

FIGS. 2A through 2F are cross-sectional views of the semiconductor device for illustrating the method for forming an isolation layer of a semiconductor device according to an embodiment of the present invention.

Figure 1A:
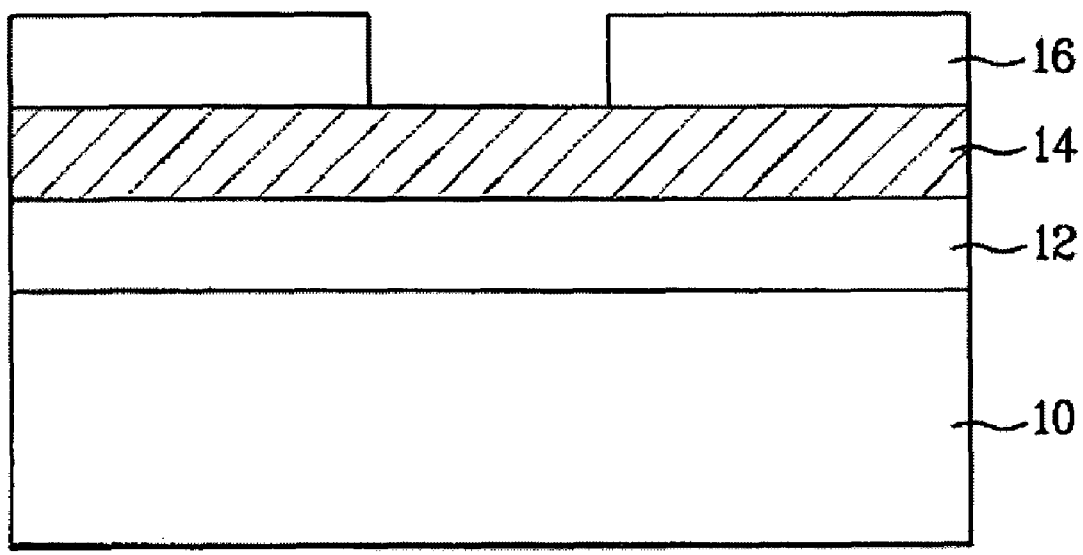
FIGS. 1A through 1E are cross-sectional views for illustrating an isolation layer of a semiconductor device using a shallow trench isolation method according to the related art.
Figure 1B:
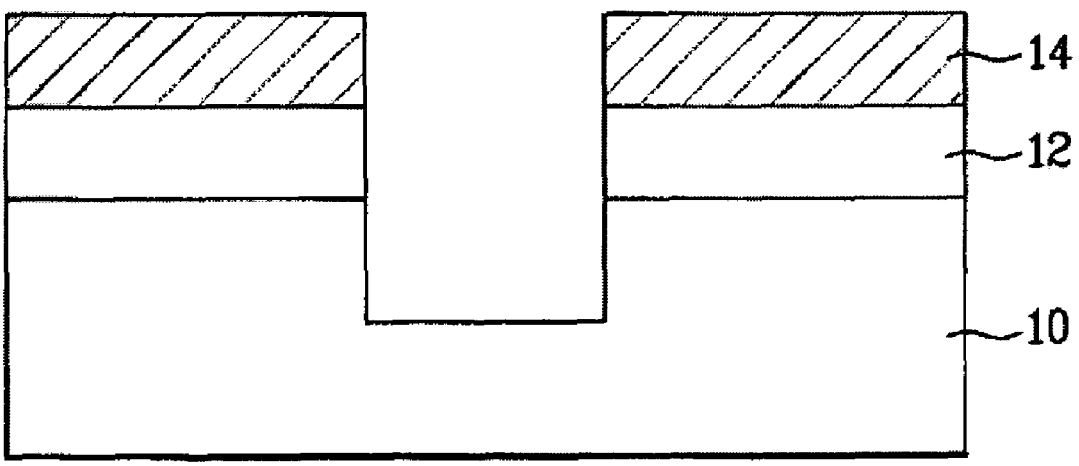
Figure 1C:
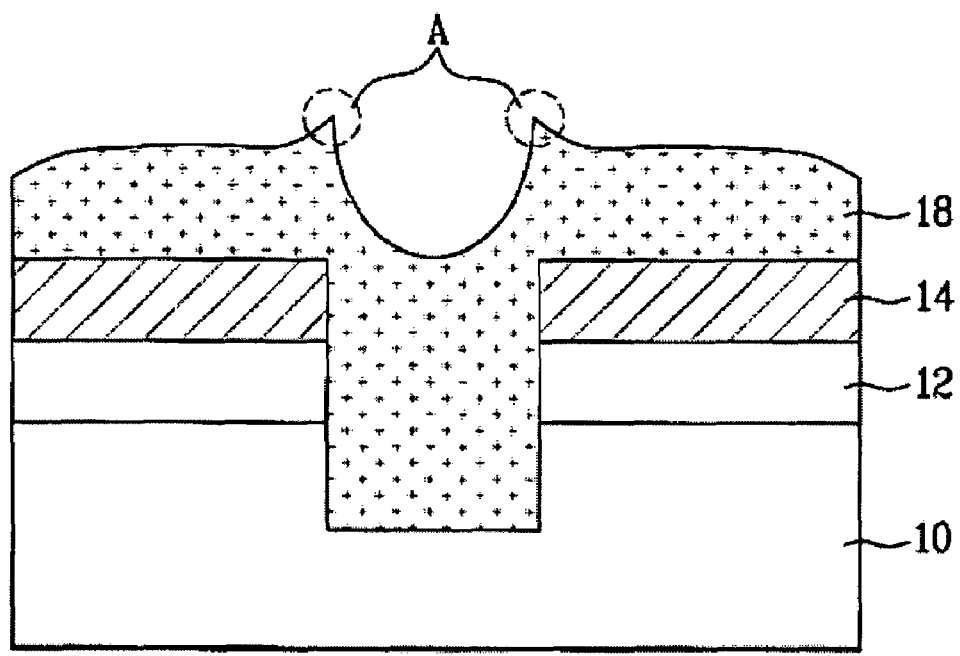
Figure 1D:
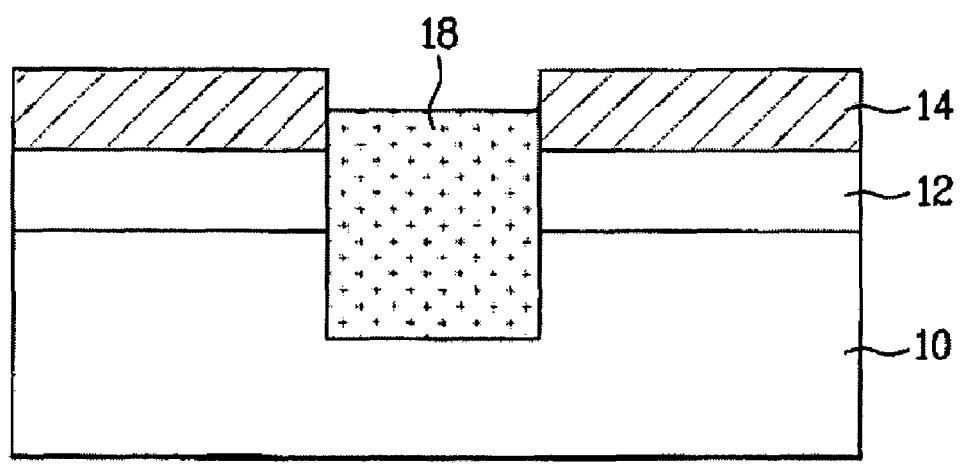
Figure 1E:
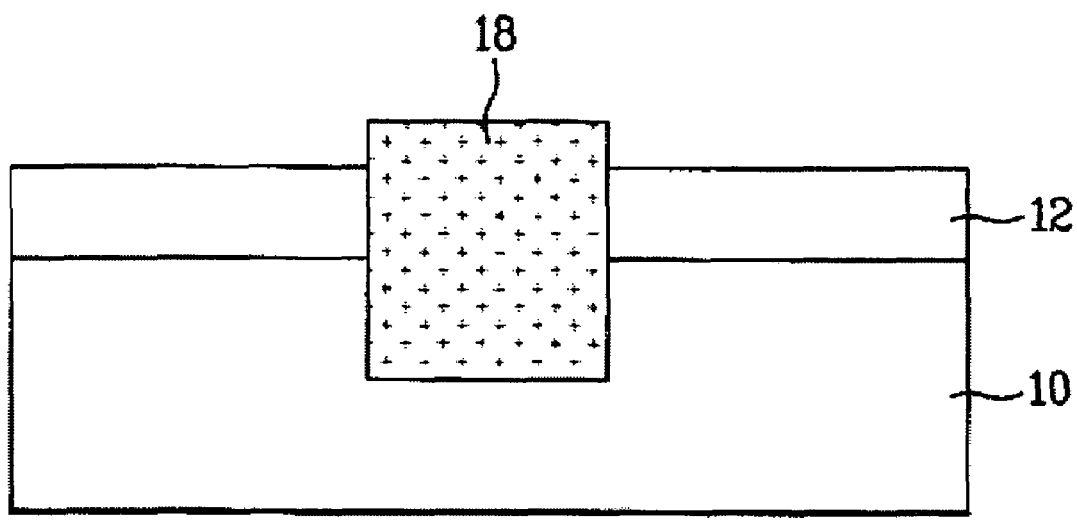
Figure 2A:
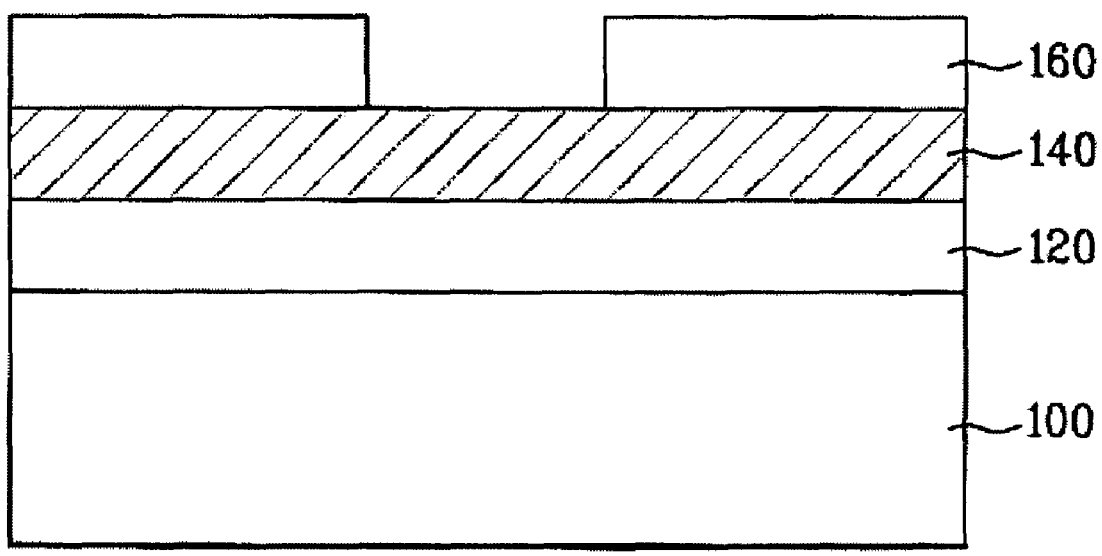
FIGS. 2A through 2F are cross-sectional views of the semiconductor device for illustrating the method for forming an isolation layer of a semiconductor device according to an embodiment of the present invention.

First, as shown in FIG. 2A, after a first insulating layer 120 and a second insulating layer 140 have been sequentially formed on the silicon substrate 100, a photoresist pattern 160 is formed at an upper portion of the second insulating layer 140 in order to expose a device isolation region.

The semiconductor substrate 100 may comprise a silicon substrate, and may further include one or more epitaxial layers of silicon and/or silicon-germanium thereon. The first insulating layer 120 may comprise an oxide layer (e.g., silicon dioxide), which may be formed by conventional thermal oxidation or CVD. The second insulating layer 140 may comprise a (silicon) nitride layer, which may have a second oxide layer (e.g., silicon dioxide, or a TEOS-based oxide) thereon, generally formed by CVD.

Figure 2B:
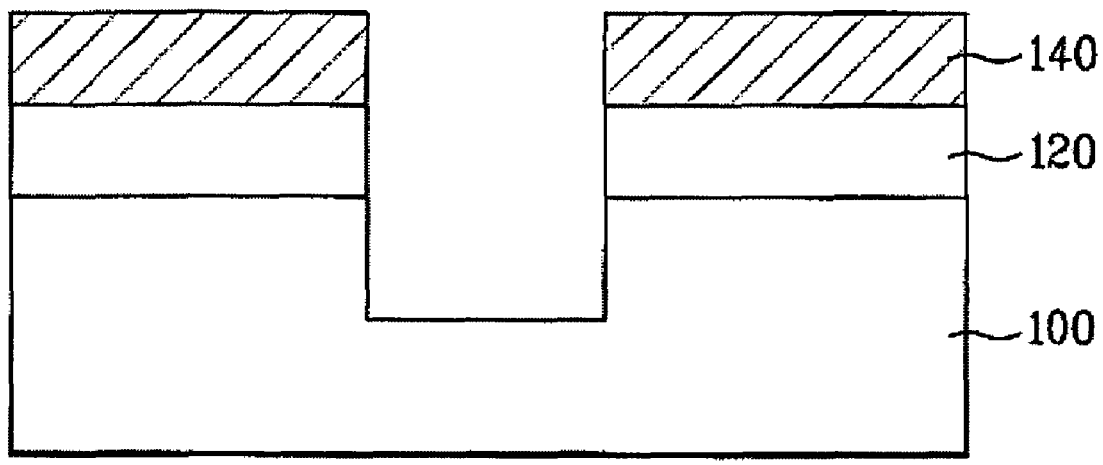

Next, as shown in FIG. 2B, the first insulating layer 120, the second insulating layer 140, and the silicon substrate 100 are etched to a predetermined depth using the photoresist pattern 160 as a mask to form a trench. Here, the region where the trench is formed may be defined as a non-active (or field) region, whereas the regions of the substrate 100 where the trench is not formed may be defined as an active region.

Figure 2C:
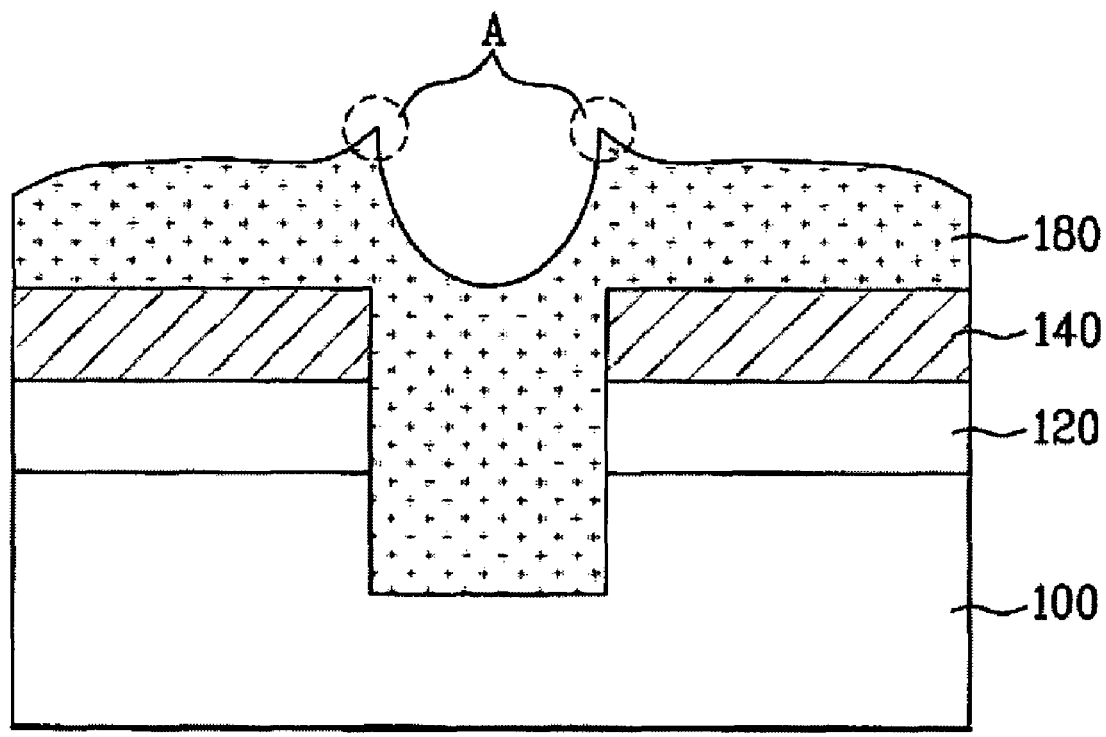

Then, as shown in FIG. 2C, an oxide layer 180 is formed on an entire surface of a resulting object including the trench. Generally, the oxide layer 180 comprises silicon dioxide, and may be formed by CVD (e.g., high density plasma-assisted CVD [HDP-CVD]), from a silane or TEOS precursor and an oxygen source (such as dioxygen, ozone, hydrogen peroxide, etc.). In addition, oxide layer 180 may further comprise a liner oxide layer (formed along the sidewalls of the trench by thermal or chemical oxidation) and/or liner nitride layer (generally on the liner oxide layer).

At this time, as shown, due to a step coverage between the trench and the active area, the oxide layer 18 may have a wave shape at an interface part therebetween. The wave shape may include a sharp top shape. Namely, the oxide layer formed at an upper edge portion of the trench may protrude in a sharp top shape.

Figure 2D:
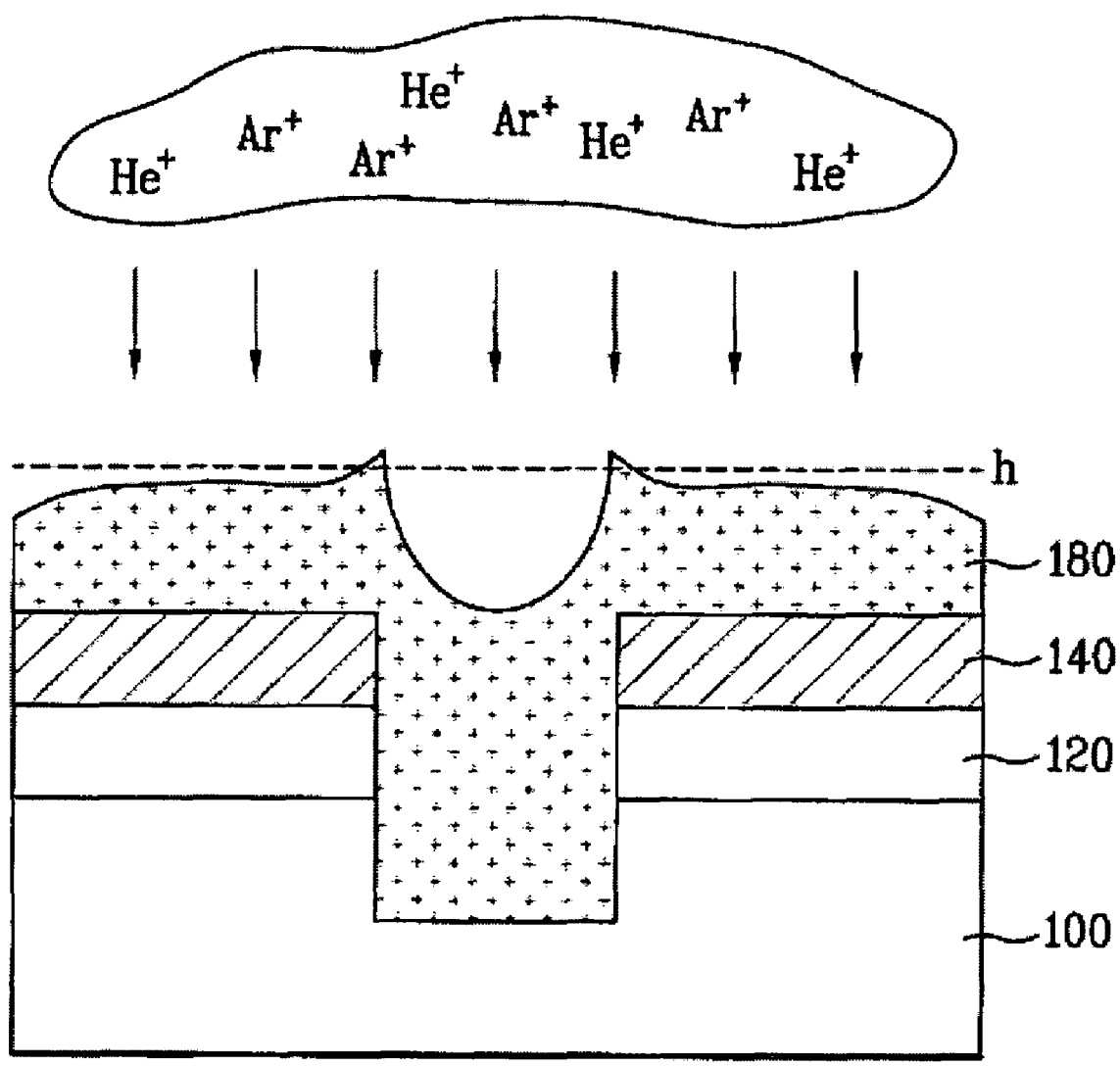

Next, as shown in FIG. 2D, sharp parts of the oxide layer 180 (and possibly other protrusions of the oxide layer 180) are removed using a plasma-sputtering process.

In the plasma-sputtering process, it is preferred that the sharp parts of the oxide layer 160 are removed by a sputtering phenomenon due to $Ar^+$ and/or $He^+$ ions, using a mixed gas of Ar and He (noble gases, or Group VIII element[s]). Alternatively, the oxide layer 180 may be exposed to a plasma formed from one or more noble gases (e.g., He, Ne, Ar, Kr, etc.), and the protrusions thereof removed by sputtering with ions generated in the plasma.

The reason for use of a noble gas mixture is as follows. Since an atomic radius of Ar is greater, and an atomic radius of He is smaller, when the Ar and the He are mixed with each other, a plasma density can be increased, so that effective sputtering can be achieved within a short (processing) time.

When the plasma-sputtering process is performed, preferably only sharp parts of the oxide layer 180 should be removed. Generally, it is unnecessary to remove remaining parts.

Accordingly, it is preferred to limit an average free path to only a sharp part of the oxide layer (to h of FIG. 2D). To do this, a pressure of the plasma-sputtering process or chamber is suitably adjusted in consideration of a height of the sharp part in the oxide layer.

Figure 2E:
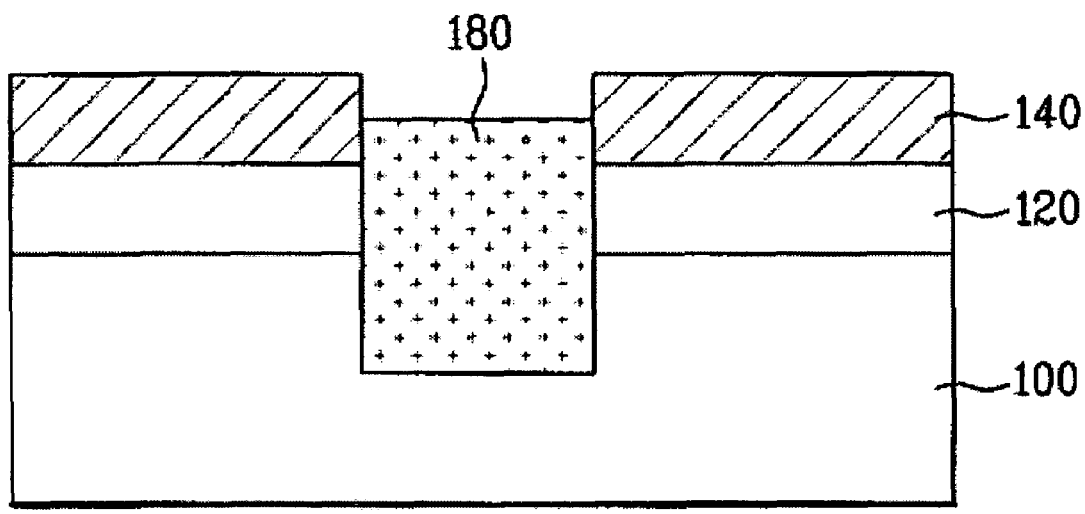

Thereafter, as shown in FIG. 2E, the oxide layer 180 is removed by chemical mechanical polishing (CMP), leaving the oxide layer 180 only in the trench.

Figure 2F:
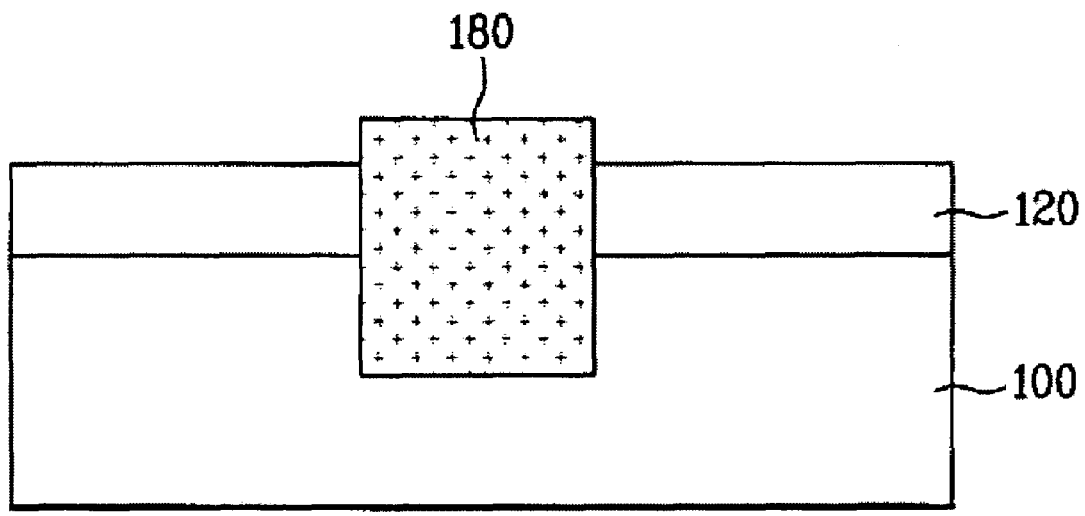

Subsequently, as shown in FIG. 2F, the second insulating layer 140 is etched to obtain an isolation layer, which is made of an oxide layer. Such etching can be wet (e.g., using aqueous phosphoric acid when the second insulating layer 140 includes a nitride) or dry (e.g., using a plasma etching chemistry that is selective for the second insulating layer 140 relative to the first insulating layer 120).

As is clear from the foregoing description, by adding a process for removing sharp parts of the oxide layer after the oxide layer has been formed on the entire surface of a semiconductor substrate having trenches therein, the occurrence of scratches in a silicon substrate during a CMP process can be reduced or prevented.

It will be apparent to those skilled in the art that various modifications and variations can be made in the present invention. Thus, it is intended that the present invention covers the modifications and variations of this invention within the scope of the appended claims and their equivalents.

What is claimed is:

1. A method for forming an isolation structure of a semiconductor device comprising:

vertically etching a region of an insulating layer and a part of an underlying semiconductor substrate corresponding to the region to form a trench;

depositing an oxide layer on an entire surface of the semiconductor substrate to fill the trench;

plasma-sputtering at least a part of a surface of the oxide layer using a mixed gas of argon and helium to remove sharp parts and/or protrusions of the oxide layer; and removing the oxide layer by chemical mechanical polishing so that the oxide layer remains only in the trench.

2. The method according to claim 1, wherein the part of the surface of the oxide layer is at an upper edge of the trench.

3. The method according to claim 1, further comprising forming the insulating layer on the semiconductor substrate.

4. The method according to claim 3, wherein the insulating layer comprises a nitride layer on a pad oxide layer.

5. The method according to claim 1, further comprising limiting an average free path to the sharp part of the oxide layer.

6. The method according to claim 5, wherein a pressure of the plasma-sputtering process is adjusted base on an average height of the sharp part in the oxide layer.

7. A method for forming an isolation structure of a semiconductor device comprising:

forming a first insulating layer on a semiconductor substrate;

forming s second insulating layer on the first insulating layer;

vertically etching regions of the first and second insulating layers and a part of the semiconductor substrate corresponding thereto to form a trench;

depositing an oxide layer on an entire surface of the semiconductor substrate to fill the trench;

plasma-sputtering at least a part of a surface of the oxide layer using a mixed gas of argon and helium to remove sharp parts and/or protrusions of the oxide layer; and removing the oxide layer by chemical mechanical polishing so that the oxide layer remains only in the trench.

8. The method according to claim 7, wherein the part of the surface of the oxide layer is at an upper edge of the trench.

9. The method according to claim 7, wherein the first insulating layer comprises an oxide layer, and the second insulating layer comprises a nitride layer.

10. The method according to claim 7, further comprising removing the second insulating layer.

11. The method according to claim 7, wherein the first insulating layer comprises an oxide layer.

12. The method according to claim 11, wherein the second insulating layer comprises a nitride layer.

13. The method according to claim 7, wherein the second insulating layer comprises a nitride layer.

14. The method according to claim 7, further comprising adjusting a pressure of the plasma-sputtering process based on an average height of the sharp part in the oxide layer to limit an average free path to the sharp part of the oxide layer.

* * * * *